US009832816B2

United States Patent
Lo et al.

(10) Patent No.: US 9,832,816 B2
(45) Date of Patent: Nov. 28, 2017

(54) ABSORBING REFLECTOR FOR SEMICONDUCTOR PROCESSING CHAMBER

(71) Applicant: Applied Materials, Inc., Santa Clara, CA (US)

(72) Inventors: Kin Pong Lo, Fremont, CA (US); Paul Brillhart, Pleasanton, CA (US); Balasubramanian Ramachandran, Santa Clara, CA (US); Satheesh Kuppurao, San Jose, CA (US); Daniel Redfield, Morgan Hill, CA (US); Joseph M. Ranish, San Jose, CA (US); James Francis Mack, Woodside, CA (US); Kailash Kiran Patalay, Santa Clara, CA (US); Michael Olsen, Scappoose, OR (US); Eddie Feigel, Forest Grove, OR (US); Richard Halpin, Hillsboro, OR (US); Brett Vetorino, Austin, TX (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 693 days.

(21) Appl. No.: 14/258,410

(22) Filed: Apr. 22, 2014

(65) Prior Publication Data

US 2014/0376898 A1    Dec. 25, 2014

Related U.S. Application Data

(60) Provisional application No. 61/838,133, filed on Jun. 21, 2013.

(51) Int. Cl.
| | |
|---|---|
| *G02B 5/08* | (2006.01) |
| *H05B 3/00* | (2006.01) |
| *H01L 21/67* | (2006.01) |

(52) U.S. Cl.
CPC ...... *H05B 3/0047* (2013.01); *H01L 21/67115* (2013.01)

(58) Field of Classification Search
CPC ......... H01L 21/67121; H01L 21/67126; H01L 21/67115; H01L 21/6715; H01L 21/67155;
(Continued)

(56) References Cited

U.S. PATENT DOCUMENTS

| | | | | |
|---|---|---|---|---|
| 5,861,609 | A | * | 1/1999 | Kaltenbrunner .... H01L 21/2686 118/50.1 |
| 6,259,062 | B1 | | 7/2001 | Pan |

(Continued)

FOREIGN PATENT DOCUMENTS

| | | |
|---|---|---|
| JP | 2003-323971 A | 11/2003 |
| JP | 2005-525693 A | 8/2005 |

(Continued)

OTHER PUBLICATIONS

International Search Report and Written Opinion dated Sep. 3, 2014 for Application No. PCT/US2014/035172.

*Primary Examiner* — Euncha Cherry
(74) *Attorney, Agent, or Firm* — Patterson + Sheridan LLP

(57) ABSTRACT

Embodiments of the disclosure generally relate to a reflector for use in a thermal processing chamber. In one embodiment, the thermal processing chamber generally includes an upper dome, a lower dome opposing the upper dome, the upper dome and the lower dome defining an internal volume of the processing chamber, a substrate support disposed within the internal volume, and a reflector positioned above and proximate to the upper dome, wherein the reflector has a heat absorptive coating layer deposited on a side of the reflector facing the substrate support.

11 Claims, 3 Drawing Sheets

(58) Field of Classification Search
CPC ............. H01L 67/242; H01L 21/67248; H01L 23/427; H01L 33/642; H01L 21/68735; H01L 21/324; H01L 21/68757
USPC .......................................................... 359/884
See application file for complete search history.

(56) References Cited

U.S. PATENT DOCUMENTS

| | | |
|---|---|---|
| 6,490,144 B1 | 12/2002 | Narendrnath et al. |
| 6,641,302 B2 | 11/2003 | Li et al. |
| 6,839,507 B2 | 1/2005 | Adams et al. |
| 6,939,610 B1 * | 9/2005 | Kaul ..................... B64G 1/226 428/323 |
| 7,812,286 B2 | 10/2010 | Sorabji et al. |
| 8,314,368 B2 | 11/2012 | Ranish et al. |
| 2005/0023267 A1 * | 2/2005 | Timans ............. H01L 21/67115 219/405 |
| 2012/0070136 A1 | 3/2012 | Koelmel et al. |

FOREIGN PATENT DOCUMENTS

| | | |
|---|---|---|
| KR | 2005-0064986 A | 6/2005 |
| KR | 2009-0071060 A | 7/2009 |

* cited by examiner

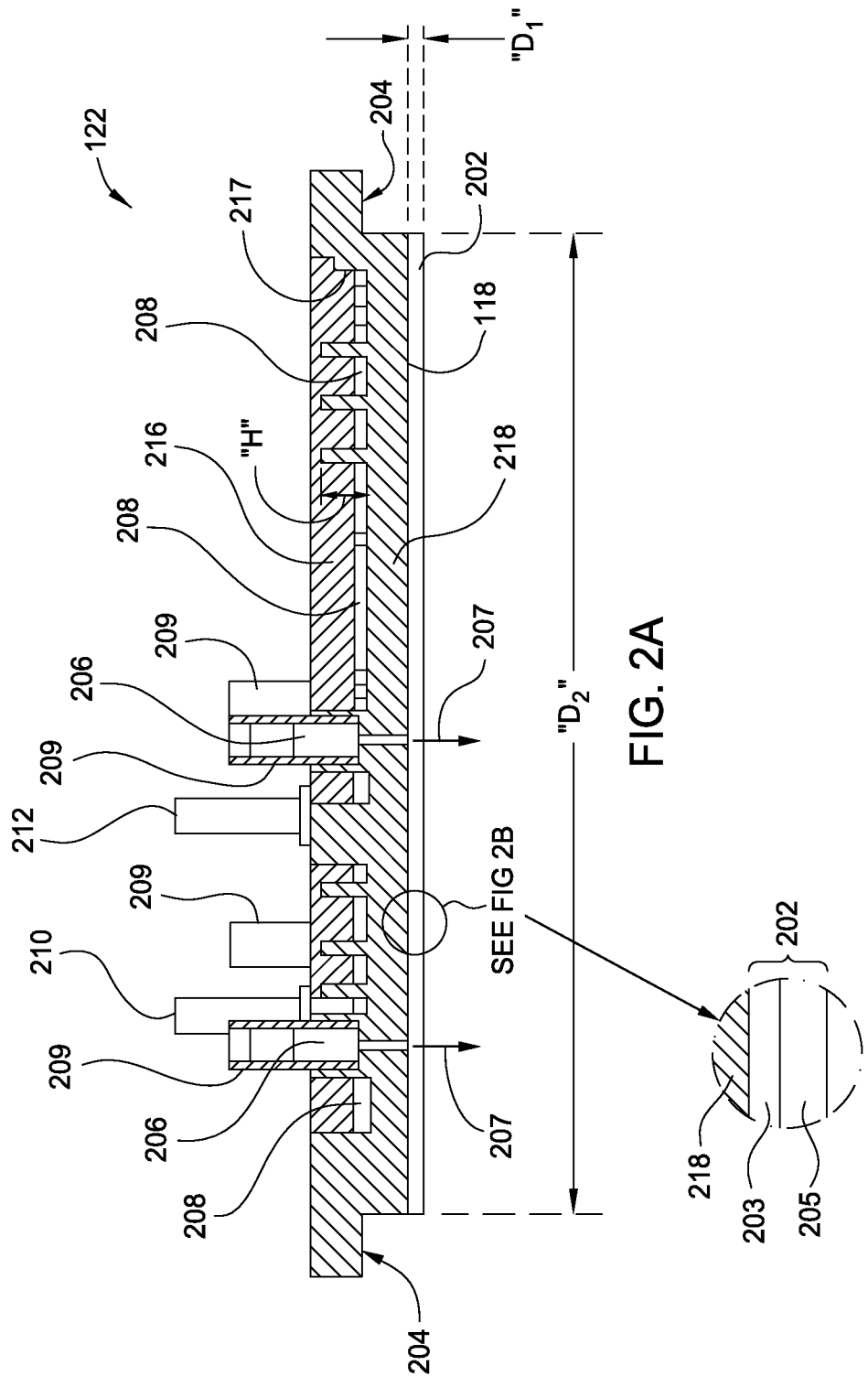

ABSORBING REFLECTOR FOR SEMICONDUCTOR PROCESSING CHAMBER

CROSS-REFERENCE TO RELATED APPLICATIONS

This application claims benefit of U.S. provisional patent application Ser. No. 61/838,133, filed Jun. 21, 2013, which is herein incorporated by reference.

BACKGROUND

Field

Embodiments of the present disclosure generally relate to a reflector for use in thermal processing chambers.

Description of the Related Art

Rapid thermal processing (RTP) and epitaxial deposition (epi) systems are employed in semiconductor chip fabrication to create, chemically alter or etch surface structures on semiconductor substrates. RTP and epi systems typically depend upon an array of high-intensity incandescent lamps fit into a lamphead and directed at the substrate. The lamps are electrically powered and can be very quickly turned on and off and a substantial fraction of their radiation can be directed to the substrate. As a result, the substrate can be very quickly heated without substantially heating the chamber and can be nearly as quickly cooled once the power is removed from the lamps.

The thermal processing chamber may include, among other components, an upper structure, a lower structure, a base ring connecting the upper structure to the lower structure, a rotating substrate support disposed between the upper structure and the lower structure, a lamphead positioned proximate to the lower structure, and a reflector positioned proximate to the upper structure. A number of infrared lamps are located in the lamphead. The lamps are divided into multiple zones. Each zone is separately powered by a lamp driver that is, in turn, controlled by a multi-input, multi-output controller. During processing, radiation from the lamps radiates through the lower structure and onto a substrate placed on the substrate support. In this manner, the substrate is heated to a required processing temperature.

However, it has been observed that radiation from the lamps can bypass the substrate and the substrate support, and radiate onto the reflector and optical pyrometers associated with the reflector. The radiation from the lamps thus creates error (also known as noise) in the pyrometry reading for the substrate, resulting in inaccurate temperature measurement. In addition, not all of the electrical energy delivered to the lamps ends up actually heating the wafer. Some of the radiant energy is absorbed by chamber components, which causes the chamber to cool down undesirably slow and therefore, longer step change times and slower process throughput.

Thus, there is a need in the art for an apparatus which enables more accurate temperature measurement and faster chamber cooling.

SUMMARY OF THE INVENTION

Embodiments of the disclosure generally relate to a reflector for use in a thermal processing chamber. In one embodiment, a reflector for use in a thermal processing chamber is provided. The reflector includes a body having a top surface and a bottom surface opposing the top surface, a heat absorptive coating layer deposited over at least a portion of the bottom surface, and a cooling channel formed in the body, wherein the cooling channel has a predetermined pattern and is configured to circulate a cooling fluid through the body.

In another embodiment, a thermal processing chamber is provided. The thermal processing chamber generally includes an upper dome, a lower dome opposing the upper dome, the upper dome and the lower dome defining an internal volume of the processing chamber, a substrate support disposed within the internal volume, and a reflector positioned above and proximate to the upper dome, wherein the reflector has a heat absorptive coating layer deposited on a side of the reflector facing the substrate support.

In yet another embodiment, a reflector for use in a thermal processing chamber is provided. The reflector includes a body having a top surface and a bottom surface opposing the top surface, one or more cooling channels formed in the body, and a heat absorptive coating layer deposited over at least a portion of the bottom surface, wherein the heat absorptive coating layer comprises a coating layer comprising a polyurethane material and a primer layer disposed between the coating layer and the bottom surface, wherein the primer layer comprises an epoxy material.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 2A is a schematic cross-sectional view of the reflector of FIG. 1 according to embodiments of the disclosure.

FIG. 2B is an enlarged, cross-sectional view of a heat absorptive coating layer of FIG. 2A according to embodiments of the disclosure.

To facilitate understanding, identical reference numerals have been used, where possible, to designate identical elements that are common to the figures. It is contemplated that elements disclosed in one embodiment may be beneficially utilized in other embodiments without specific recitation.

DETAILED DESCRIPTION

Embodiments of the disclosure generally relate to a reflector for use in a thermal processing chamber. The thermal processing chamber may include, among other components, an upper dome structure, a lower dome structure, a base ring connecting the upper dome structure to the lower dome structure, a rotating substrate support disposed between the upper dome structure and the lower dome structure, and a reflector positioned above and proximate to the upper dome structure. The reflector may have a general flat body having a bottom surface and a top surface opposing the bottom surface. The bottom surface, which faces the substrate support, has an absorptive coating disposed thereon. The absorptive coating is configured to absorb thermal radiation from the substrate or chamber components.

Embodiments disclosed herein may be practiced in the Applied CENTURA® RP EPI chamber, available from Applied Materials, Inc. of Santa Clara, California. It is contemplated that other thermal processing chamber, such as an RTP chamber, or any processing chambers available from other manufacturers may also benefit from embodiments disclosed herein.

Exemplary Chamber Hardware

Figure 1:
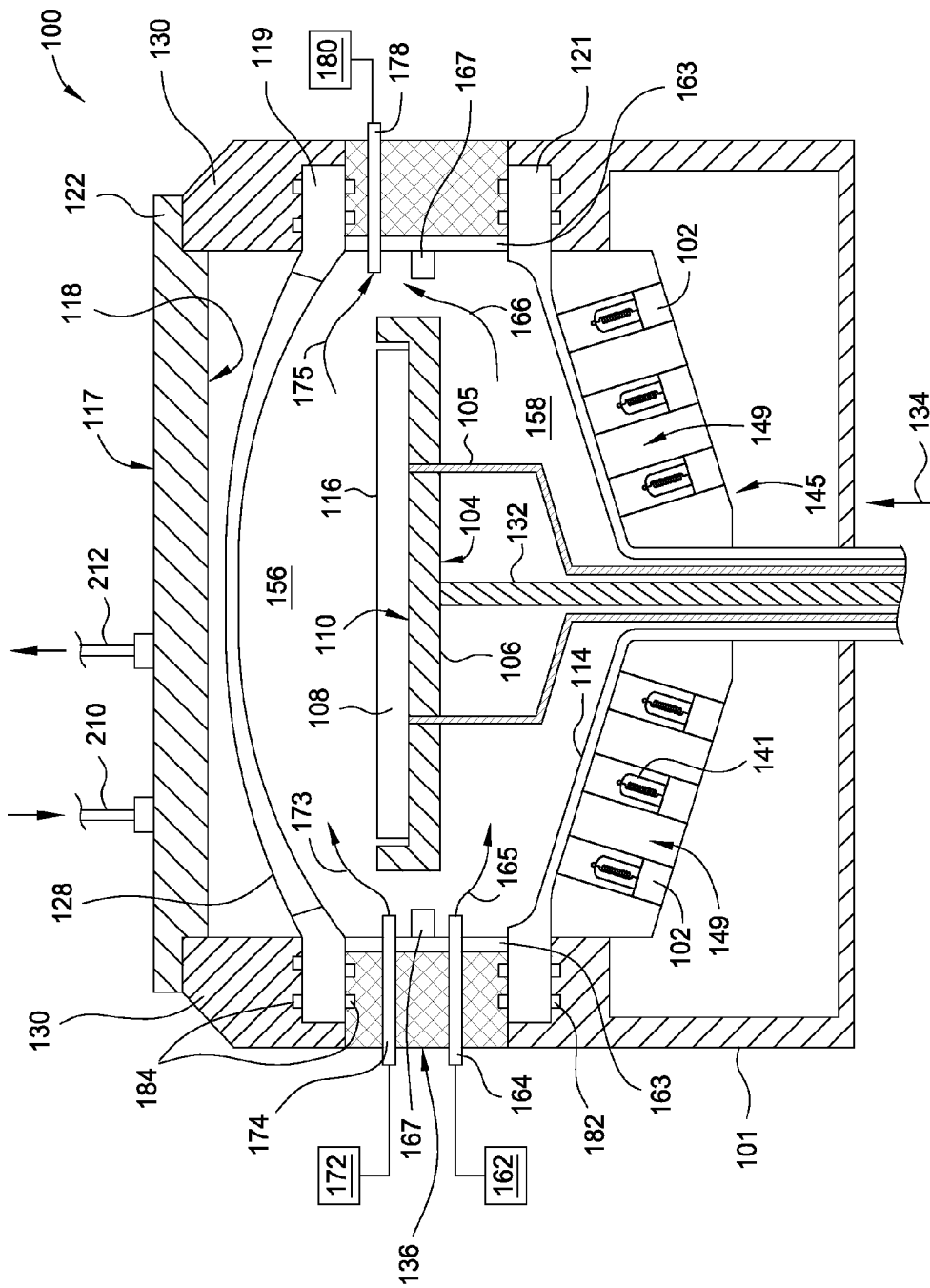
FIG. 1 is a schematic sectional view of a thermal process chamber 100 according to embodiments of the disclosure.

FIG. 1 is a schematic sectional view of a thermal process chamber 100 according to one embodiment of the disclosure. The process chamber 100 may be used to process one or more substrates, including the deposition of a material on an upper surface of a substrate 108. The process chamber 100 may include an array of radiant heating lamps 102 for heating, among other components, a back side 104 of a substrate support 106 disposed within the process chamber 100. In some embodiments, the array of radiant heating lamps may be alternatively or additionally disposed over the upper dome 128. The substrate support 106 may be a disk-like substrate support 106 as shown, or may be a ring-like substrate support which supports the substrate from the edge of the substrate to facilitate exposure of the substrate to the thermal radiation of the lamps 102.

The substrate support 106 is located within the process chamber 100 between an upper dome 128 and a lower dome 114. The upper dome 128, the lower dome 114 and a base ring 136 that is disposed between the upper dome 128 and lower dome 114 generally define an internal region of the process chamber 100. The substrate 108 (not to scale) can be brought into the process chamber 100 and positioned onto the substrate support 106 through a loading port. The loading port is angularly offset at about 90° with respect to a process gas supply source 172, and is obscured by the substrate support 106 in FIG. 1.

The substrate support 106 is shown in an elevated processing position, but may be vertically traversed by an actuator (not shown) to a loading position below the processing position to allow lift pins 105 to contact the lower dome 114 passing through holes in the substrate support 106 and the central shaft 132, and raise the substrate 108 from the substrate support 106. A robot (not shown) may then enter the process chamber 100 to engage and remove the substrate 108 therefrom though the loading port 103. The substrate support 106 then may be actuated up to the processing position to place the substrate 108, with its device side 116 facing up, on a front side 110 of the substrate support 106.

The substrate support 106, while located in the processing position, divides the internal volume of the process chamber 100 into a process gas region 156 that is above the substrate, and a purge gas region 158 below the substrate support 106. The substrate support 106 is rotated during processing by a central shaft 132 to minimize the effect of thermal and process gas flow spatial anomalies within the process chamber 100, and thus facilitate uniform processing of the substrate 108. The substrate support 106 is supported by the central shaft 132, which moves the substrate 108 in an up and down direction 134 during loading and unloading, and in some instances, processing of the substrate 108. The substrate support 106 may be formed from silicon carbide or graphite coated with silicon carbide to absorb radiant energy from the lamps 102 and conduct the radiant energy to the substrate 108.

In generally, the central window portion of the upper dome 128 and the bottom of the lower dome 114 may be formed from an optically transparent material such as quartz to direct radiations from the lamps without significant absorption. In some cases, the peripheral flange 119 of the upper dome 128, which engages the central window portion around a circumference of the central window portion, and the peripheral flange 121 of the lower dome 114, which engages the bottom portion around a circumference of the bottom portion, may all be formed from an opaque quartz to protect the O-rings 182, 184 proximity to the peripheral flanges from being directly exposed to the heat radiation.

One or more lamps, such as an array of lamps 102, can be disposed adjacent to and beneath the lower dome 114 in a specified, optimal desired manner around the central shaft 132 to independently control the temperature at various regions of the substrate 108 as the process gas passes over, thereby facilitating the deposition of a material onto the upper surface of the substrate 108. While not discussed here in detail, the deposited material may include gallium arsenide, gallium nitride, or aluminum gallium nitride.

The lamps 102 may be configured to include bulbs 141 and be configured to heat the substrate 108 to a temperature within a range of about 200 degrees Celsius to about 1600 degrees Celsius. Each lamp 102 is coupled to a power distribution board (not shown) through which power is supplied to each lamp 102. The lamps 102 are positioned within a lamphead 145 which may be cooled during or after processing by, for example, a cooling fluid introduced into channels 149 located between the lamps 102. The lamphead 145 conductively and radiatively cools the lower dome 114 due in part to the close proximity of the lamphead 145 to the lower dome 114. The lamphead 145 may also cool the lamp walls and walls of the reflectors (not shown) around the lamps. Alternatively, the lower dome 114 may be cooled by a convective approach. The lampheads 145 may or may not be in contact with the lower dome 114.

A circular shield 167 may be optionally disposed around the substrate support 106 and surrounded by a liner assembly 163. The shield 167 prevents or minimizes leakage of heat/light noise from the lamps 102 to the device side 116 of the substrate 108 while providing a pre-heat zone for the process gases. The shield 167 may be made from CVD SiC, sintered graphite coated with SiC, grown SiC, opaque quartz, coated quartz, or any similar, suitable material that is resistant to chemical breakdown by process and purging gases.

The liner assembly 163 is sized to be nested within or surrounded by an inner circumference of the base ring 136. The liner assembly 163 shields the processing volume (i.e., the process gas region 156 and purge gas region 158) from metallic walls of the process chamber 100. The metallic walls may react with precursors and cause contamination in the processing volume. While the liner assembly 163 is shown as a single body, the liner assembly 163 may include one or more liners. The liner assembly 163 and/or the shield 167 may be omitted from the process chamber 100.

Process gas supplied from a process gas supply source 172 is introduced into the process gas region 156 through a process gas inlet 174 formed in the sidewall of the base ring 136. The process gas inlet 174 is configured to direct the process gas in a generally radially inward direction. During the film formation process, the substrate support 106 may be located in the processing position, which is adjacent to and at about the same elevation as the process gas inlet 174, allowing the process gas to flow up and round along flow path 173 across the upper surface of the substrate 108 in a laminar flow fashion. The process gas exits the process gas region 156 (along flow path 175) through a gas outlet 178 located on the side of the process chamber 100 opposite the process gas inlet 174. The process gas supply source 172 may be configured to supply multiple types of process gases, for example, a group III precursor gas and a group V precursor gas. The multiple process gases may be introduced into the process chamber 100 through the same process gas inlet 174, or through separate gas inlets (not shown). Removal of the process gas through the gas outlet 178 may be facilitated by a vacuum pump 180 coupled thereto. As the process gas inlet 174 and the gas outlet 178 are aligned to each other and disposed approximately at the same elevation to enable a generally planar, uniform gas flow across the substrate 108.

Purge gas may be supplied from a purge gas source 162 to the purge gas region 158 through an optional purge gas inlet 164 (or through the process gas inlet 174) formed in the sidewall of the base ring 136. The purge gas inlet 164 is disposed at an elevation below the process gas inlet 174. If the circular shield 167 or a pre-heat ring (not shown) is used, the circular shield or the pre-heat ring may be disposed between the process gas inlet 174 and the purge gas inlet 164. In either case, the purge gas inlet 164 is configured to direct the purge gas in a generally radially inward direction. During the film formation process, the substrate support 106 may be located at a position such that the purge gas flows down and round along flow path 165 across back side 104 of the substrate support 106 in a laminar flow fashion. Without being bound by any particular theory, the flowing of the purge gas is believed to prevent or substantially avoid the flow of the process gas from entering into the purge gas region 158, or to reduce diffusion of the process gas entering the purge gas region 158 (i.e., the region under the substrate support 106). The purge gas exits the purge gas region 158 (along flow path 166) and is exhausted out of the process chamber through the gas outlet 178, which is located on the side of the process chamber 100 opposite the purge gas inlet 164.

During the purging process the substrate support 106 may be located in an elevated position to allow the purge gas to flow laterally across the back side 104 of the substrate support 106. The process gas inlet, the purge gas inlet and the gas outlet are shown for illustrative purpose. The position, size, or number of gas inlets or outlet etc. may be adjusted to facilitate a uniform deposition of material on the substrate 108.

Reflector with Absorptive Coating

In various embodiments, a reflector 122 is positioned above and proximate to the upper dome 128. The reflector 122 is generally a plate body having a top surface 117 and a bottom surface 118 opposing the top surface 117. As will be discussed below with respective to FIG. 2A, the reflector 122 may consist of two pieces: a top plate 216 and a bottom plate 218. Alternatively, the two pieces may be integrated as one-piece body. The periphery of the reflector 122 may be supported by a clamp ring 130, which is configured to secure the upper dome 128 to the base ring 136. The clamp ring 130 is disposed relatively above the base ring 136 and is fastened to the process chamber 100 by fastening receptacles (not shown) disposed around the clamp ring 130. The reflector 122 can be made of a metal such as aluminum or stainless steel.

To improve the efficiency of radiant energy delivery from the lamps to the substrate to be processed, a reflector is positioned so that some of thermal radiation that is radiating off the substrate 108 can be reflected back onto the substrate 108. In the past, such a reflection is achieved by coating a reflector area with a highly reflective coating material such as gold. However, it has been observed that the reflective coating material would result in difficulty in cool down as the thermal radiation released during cool down is returned to the process chamber, rendering the throughput to suffer. In order to improve the chamber cooling efficiency, the present inventors have proposed to coat the reflector 122 with a heat absorptive material. The heat absorptive material is chosen to absorb a majority of thermal radiation from the substrate and/or the chamber components at specific wavelengths of interest while redirecting a small or negligent portion of the radiation back onto the substrate 108. By making the reflective surface of the reflector 122 absorbing, thermal radiation delivered during cool down can be absorbed by the reflector 122 and thus more efficiently transferred from the process chamber. The embodiments of this disclosure disclosed herein are more clearly described with reference to the FIG. 2A below.

FIG. 2A is a schematic cross-sectional view of the reflector 122 of FIG. 1 according to embodiments of the disclosure. The reflector 122 may have a general cylindrical shape body with a portion 204 flared out from an outer circumference of the body. The reflector 122 has a heat absorptive coating layer 202 deposited on the entire bottom surface 118 of the reflector 122. If desired, the heat absorptive coating layer 202 may only cover a portion of the bottom surface 118. For example, the heat absorptive coating layer 202 may cover about 20% to about 95%surface area of the bottom surface 118. In various examples, the heat absorptive coating layer 202 may cover about 25%, about 30%, about 40%, about 50%, about 60%, about 70%, about 80%, about 90% surface area of the bottom surface 118 of the reflector 122. The heat absorptive coating layer 202 may have any desired pattern to assist in heat dissipation from the process chamber by absorbing radiation from one or more components of the chamber and/or the substrate. If some examples, the entire exposed surface of the reflector 122 may be coated with the heat absorptive coating layer 202.

The heat absorptive coating layer 202 can be any material which is capable of absorbing thermal radiation. The heat absorptive coating layer 202 may exhibit low outgassing characteristics (e.g., total mass loss less than 2%) while providing high thermal absorptivity properties. The heat absorptive coating layer 202 may be a single layer or a layer stack. In either case, the material of the heat absorptive coating layer is selected to absorb thermal radiation at a wavelength of 1 micron to 4 micron. FIG. 2B is an enlarged, cross-sectional view of the heat absorptive coating layer 202 of FIG. 2A according to embodiments of the disclosure. In one embodiment shown in FIG. 2B, the heat absorptive coating layer 202 is a layer stack comprising a bottom primer layer 203 and a top coating layer 205. The bottom primer layer 203 may be a two-component epoxy material suitable for use on properly prepared aluminum or stainless steel surface of the bottom plate 218 to provide required protection against corrosion. One exemplary epoxy material that is used in the present disclosure as the bottom primer layer is Aeroglaze® 9929 Epoxy Primer, which is commercially available from Lord Corporation located in Cary, N.C.

The top coating layer 205 may be a polyurethane material to provide required thermal absorptivity properties. One exemplary polyurethane material that is used in the present disclosure as the top coating layer is Aeroglaze® Z306 coating, which is commercially available from Lord Corporation located in Cary, N.C. It is contemplated that other heat absorptive material, such as a carbon black paint or a composition including graphite, may also be used. Embodiments disclosed herein are not intended to be limiting of possible embodiments of this disclosure disclosed herein.

The total thickness "$D_1$" of the heat absorptive coating layer 202 may be between about 0.03 mm and about 0.1 mm, for example about 0.05 mm to about 0.07 mm. The surface diameter "$D_2$" of the heat absorptive coating layer 202 may be between about 200 mm and about 500 mm, for example about 300 mm to about 400 mm. In one example, the heat absorptive coating layer 202 has a surface diameter of about 350 mm. The thickness and surface diameter of the heat absorptive coating layer 202 may vary depending upon the size of the reflector 122 and application.

By having the bottom surface 118 of the reflector 122 (or any surface exposed to the thermal radiation) coated with the heat absorptive coating layer 202, the radiation from the substrate and/or the chamber components can be absorbed, rather than reflected. The absorption of the radiation at the reflector 122 is also believed to reduce the noise received by the optical pyrometers 206 that are provided within the reflector 122. Further, forming a heat absorptive coating layer on the reflector 122 will enhance radiative loss and help achieve faster cooldown of process chamber 100.

The reflector 122 may include a plurality of optical pyrometers 206. The optical pyrometers 206 may be embedded in the reflector 122 and configured to emit a focal beam 207 directed downward through an upper dome (not shown, such as the upper dome 128 of FIG. 1) and onto a desired region of the substrate and the substrate support. The focal beam 207 of the optical pyrometers 206 is adapted to measure a temperature of the substrate support 106 and/or the substrate 108 by sensing of radiation emitted from the backside of the substrate support 106 or the substrate 108. The pyrometer reading is then converted to temperature based on the surface emissivity of the substrate support or substrate. The optical pyrometers 206 may be disposed within an adapter tube 209. The position of the optical pyrometers 206 may be arranged with minimal background radiation from the lamps 102 directly reaching the optical pyrometers 206.

Figure 3A:
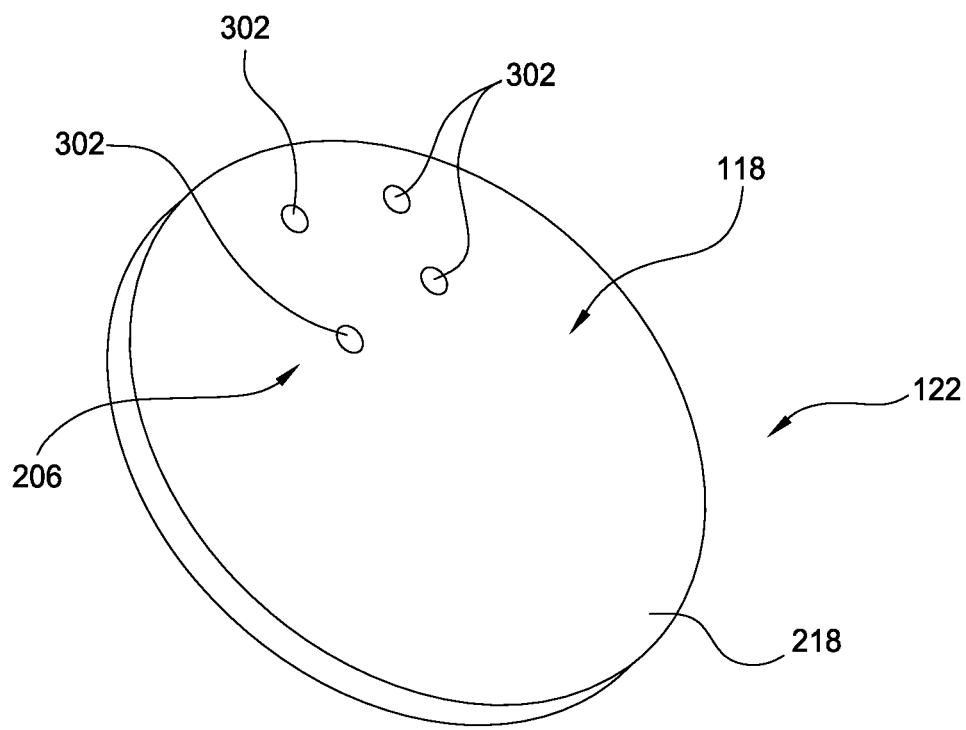
FIG. 3A is a perspective bottom view of a bottom plate of a reflector showing a possible arrangement of optical pyrometers.
Figure 3B:
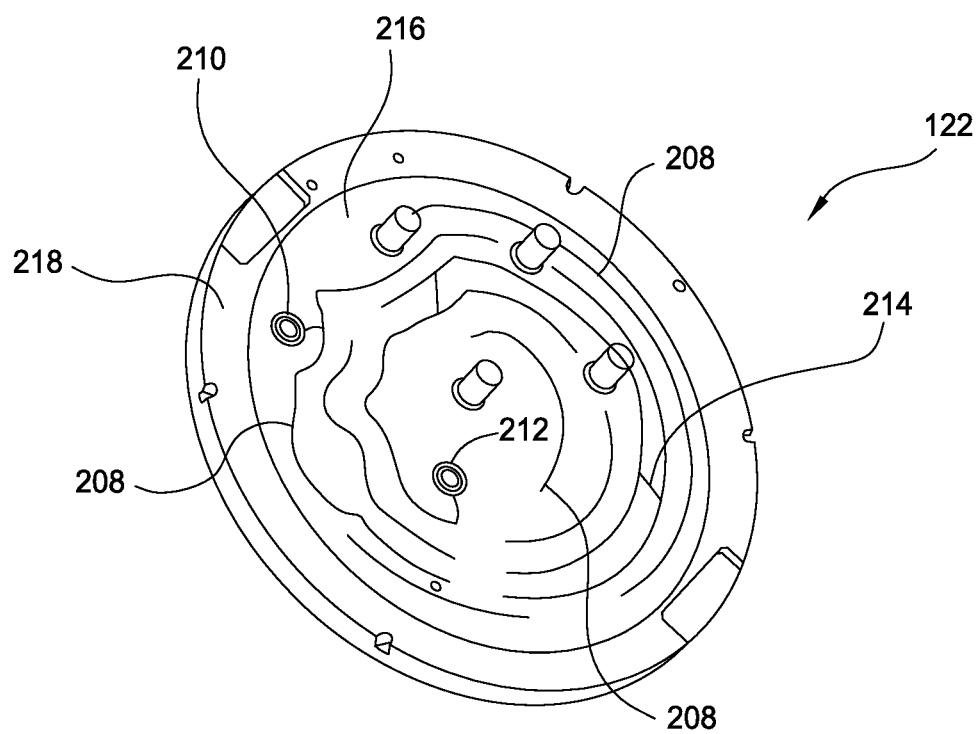
FIG. 3B is a perspective top view of a reflector showing a top plate placed on a bottom plate of the reflector.

FIG. 3A is a perspective bottom view of the bottom plate 218 of the reflector 122 showing a possible arrangement of the optical pyrometers 206. The bottom surface 118 of the reflector 122 is the side facing the substrate. The openings form through a portion of the bottom plate 218 and the heat absorptive coating layer 202 deposited on the bottom plate 218. The opening 302 represents an exemplary location of the optical pyrometers 206 and is sized to allow the focal beam to pass through. In one example, the opening 302 may be about 5 mm to about 20 mm in diameter, for example about 10 mm to about 15 mm in diameter. FIG. 3B is a perspective top view of a reflector 122 showing the top plate 216 placed on the bottom plate 218 of the reflector 122. The bottom plate 218 may have a diameter relatively larger than that of the top plate 216. The bottom plate 218 may be about 350 mm to about 450 mm in diameter. In one example, the bottom plate 218 is about 360 mm to about 380 mm in diameter. The bottom plate 218 may have a general cup shape to allow the top plate 216 to dispose on and within an inner circumference 217 of the bottom plate 218. The top plate 216 and the bottom plate 218, when combined, defines the space for accommodation of the optical pyrometers 206 and the cooling features, such as the cooling channels 208 that can be better seen in FIG. 2A. It should be appreciated by one skilled in the art that the position of the optical pyrometers 206 is for illustrative purpose only and may vary depending upon the structural relationship of the optical pyrometers 206 and the substrate/substrate support. In addition, while four optical pyrometers 206 are shown, more or less optical pyrometers 206 are contemplated.

The reflector 122 may also provide with one or more cooling features, such as cooling channels 208, for cooling of the chamber components. Cooling channels 208 circulate a cooling fluid, such as water, through and around the inner body of the reflector 122. The cooling fluid may be introduced to the cooling channels 208 through an inlet 210 and circulates through the channels 208 to emerge through an outlet 212. The cooling channels 208 may be connected by a ramp 214 that allows the cooling fluid to flow from one of the cooling channels to the other cooling channel. The cooling channels 208 may run horizontally along the side of the reflector 122 in any desired pattern covering a portion or entire surface of the reflector 122. For example, the cooling channels 208 may have a general sinuous geometry such as a serpentine pattern or the like.

The cooling fluid absorbs heat from the reflector 122 for cooling the reflector 122 or other chamber component (such as the upper dome 128 or clamp ring 130). The cooling fluid may flow in a countercurrent fashion through the reflector 122. The cooling channels 208 may be formed with a height "$H_1$" (FIG. 2A) of about 10 mm to about 30 mm, for example about 15 mm to about 20 mm. It is contemplated that the pattern of the cooling channels 208 and the arrangement of the inlet 210 and outlet 212 are for illustrative purpose and may vary depending upon the configuration of the thermal process chamber.

In sum, embodiments of the present disclosure enable more rapid cooldown time of a thermal process chamber by coating a top reflector with a heat absorptive layer. Therefore, a majority of thermal radiation from a substrate and/or chamber components can be absorbed by the reflector, rather than reflected back onto the substrate or the chamber components. The absorption of the radiation at the top reflector also reduces the noise received by the optical pyrometers that are provided within the reflector.

While the foregoing is directed to embodiments of the present disclosure, other and further embodiments of the disclosure may be devised without departing from the basic scope thereof, and the scope thereof is determined by the claims that follow.

We claim:
1. A reflector for a processing chamber, comprising:
a body having a top surface, a bottom surface opposing the top surface, a cooling channel formed in the body; and
a heat absorptive coating layer deposited over at least a portion of the bottom surface, wherein the heat absorptive coating layer comprises:
a primer layer comprising an epoxy material; and
a coating layer comprising a polyurethane material, wherein the reflector is located on an external portion of the processing chamber and the processing chamber comprises an upper dome and a lower dome defining an internal volume enclosing a substrate support.

2. The reflector of claim 1, wherein the heat absorptive coating layer absorbs thermal radiation at a wavelength of 1 micron to 4 micron.

3. The reflector of claim 1, wherein the heat absorptive coating layer has a thickness of about 0.03mm and about 0.1mm.

4. The reflector of claim 1, further comprising:
an optical pyrometer positioned to emit a focal beam passing through the heat absorptive coating layer.

5. A reflector for a processing chamber, comprising:
a plate having a top surface, a bottom surface opposing the top surface, and one or more cooling channels defined between the top surface and the bottom surface; and
a heat absorptive coating layer deposited over at least a portion of the bottom surface of the plate, wherein the heat absorptive coating layer comprises a coating layer comprising a polyurethane material, wherein the reflector is located on an external portion of the processing chamber and the processing chamber comprises an upper dome and a lower dome defining an internal volume enclosing a substrate support.

6. The reflector of claim 5, wherein the heat absorptive coating layer further comprising:
a primer layer disposed between the coating layer and the bottom surface, wherein the primer layer comprises an epoxy material.

7. The reflector of claim 5, wherein the heat absorptive coating layer absorbs thermal radiation at a wavelength of 1 micron to 4 micron.

8. The reflector of claim 5, wherein the one or more cooling channels are arranged in a general sinuous geometry.

9. The reflector of claim 1, wherein the primer layer is disposed between the coating layer and the bottom surface.

10. The reflector of claim 1, wherein the optical pyrometer is disposed within an adapter tube formed in the top surface of the body.

11. The reflector of claim 5, further comprising a plurality of optical pyrometers disposed in the plate.

* * * * *